United States Patent
Miyamoto

(10) Patent No.: US 8,243,767 B2
(45) Date of Patent: Aug. 14, 2012

(54) VERTICAL-CAVITY SURFACE-EMITTING LASER (VCSEL) DEVICE AND THE METHOD OF MANUFACTURING THEREOF

(75) Inventor: Yasuaki Miyamoto, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 12/861,982

(22) Filed: Aug. 24, 2010

(65) Prior Publication Data

US 2010/0316081 A1   Dec. 16, 2010

Related U.S. Application Data

(62) Division of application No. 11/491,705, filed on Jul. 24, 2006, now abandoned.

(30) Foreign Application Priority Data

Nov. 29, 2005   (JP) .................................. 2005-343183

(51) Int. Cl.
*H01S 5/02* (2006.01)
*H01S 5/183* (2006.01)

(52) U.S. Cl. ............. 372/46.012; 372/50.11; 372/50.12; 372/50.124

(58) Field of Classification Search ............. 372/46.012, 372/50.12, 50.11, 50.124
See application file for complete search history.

(56) References Cited

U.S. PATENT DOCUMENTS

| | | | | |
|---|---|---|---|---|
| 5,357,123 A * | 10/1994 | Sugawara | .................. | 257/88 |
| 5,729,563 A * | 3/1998 | Wang et al. | ............... | 372/50.23 |
| 6,465,811 B1 * | 10/2002 | Peters et al. | .................... | 257/99 |
| 6,658,040 B1 * | 12/2003 | Hu et al. | ........................ | 372/96 |
| 6,687,268 B2 * | 2/2004 | Kitamura et al. | ............... | 372/22 |
| 6,741,630 B2 * | 5/2004 | Takiguchi | ........................ | 372/96 |
| 7,061,956 B2 * | 6/2006 | Eitel | ............................ | 372/50.1 |
| 2004/0101009 A1 | 5/2004 | Johnson et al. | | |
| 2004/0114653 A1 * | 6/2004 | Omori | ............................ | 372/46 |
| 2004/0114655 A1 * | 6/2004 | Peters et al. | .................... | 372/50 |

FOREIGN PATENT DOCUMENTS

| | | |
|---|---|---|
| JP | 10-098212 | 4/1998 |
| JP | 2000-208811 | 7/2000 |
| JP | 3232152 | 9/2001 |
| JP | 2004-200210 | 7/2004 |
| JP | 2004-214332 | 7/2004 |
| JP | 2004-319553 | 11/2004 |
| JP | 2004-349553 | 12/2004 |

* cited by examiner

*Primary Examiner* — Jessica Stultz
*Assistant Examiner* — Michael Carter
(74) *Attorney, Agent, or Firm* — Fildes & Outland, P.C.

(57) ABSTRACT

A Vertical-Cavity Surface-Emitting Laser (VCSEL) device includes a substrate, a first semiconductor multi-layer film of a first conductive type formed on the substrate, an active layer, a second semiconductor multi-layer film of a second conductive type, an electrode pad electrically coupled to the second semiconductor multi-layer film, and a post structure formed on the substrate, the post structure comprising a light emitter, the post structure being continuously surrounded by a first groove, and a second groove being continuously formed outside of the first groove with respect to the post structure.

15 Claims, 17 Drawing Sheets

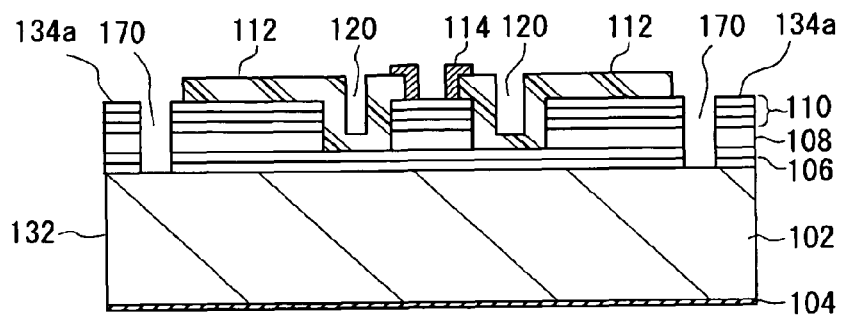
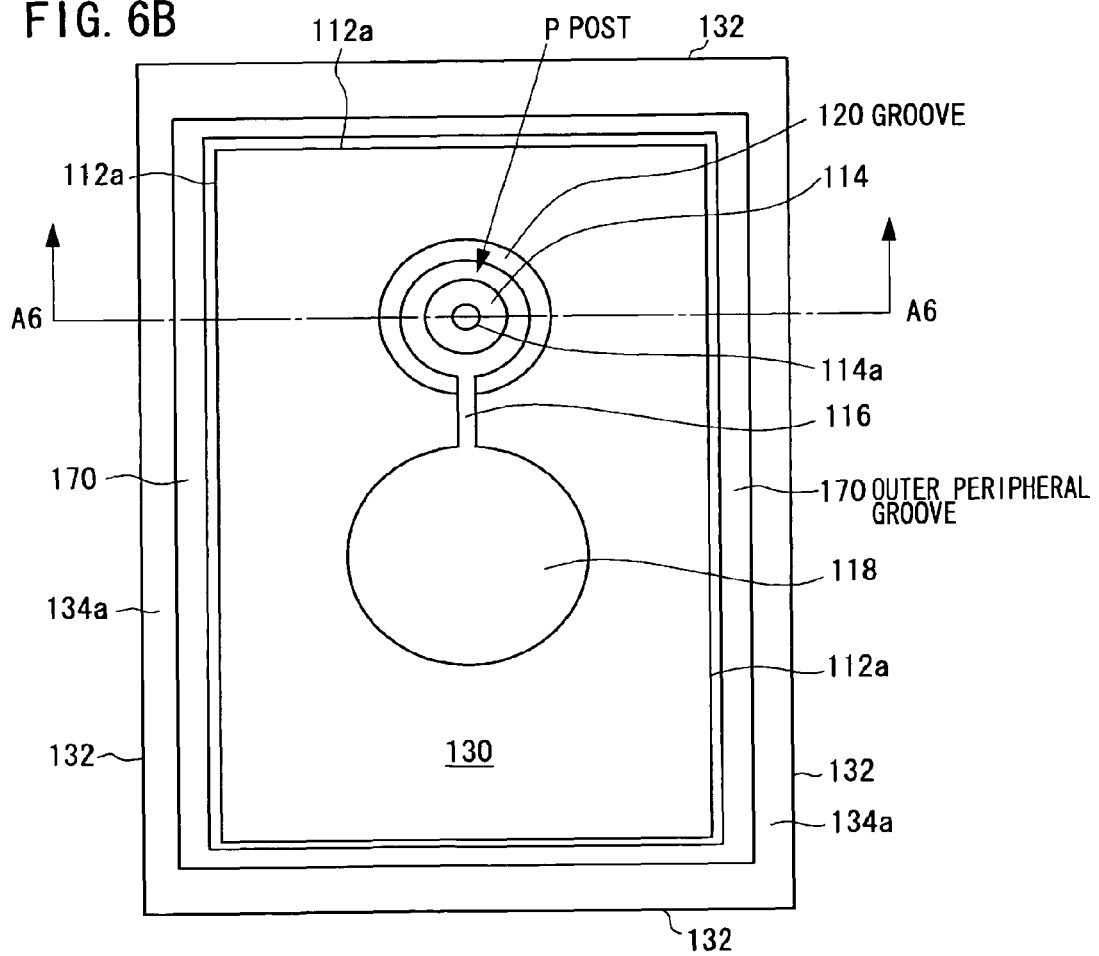

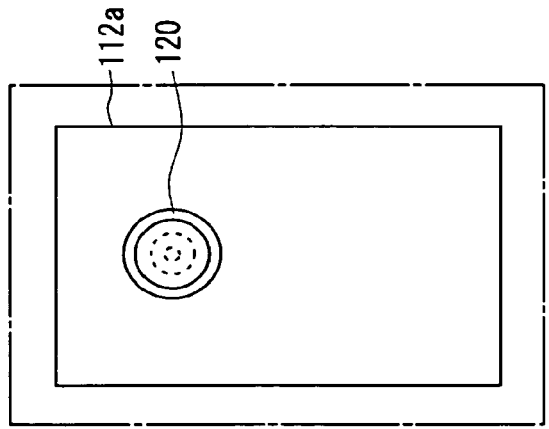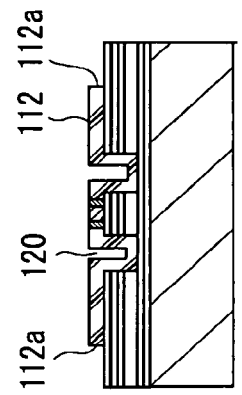
FIG. 10C
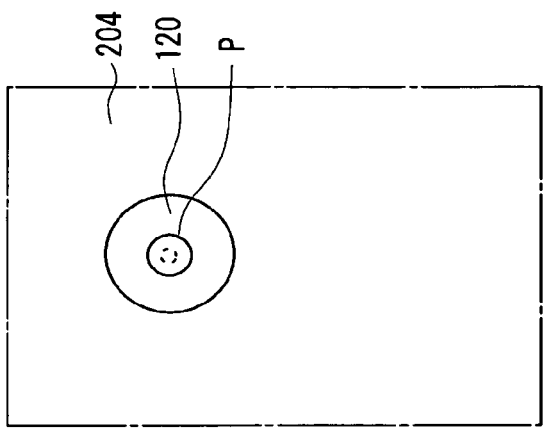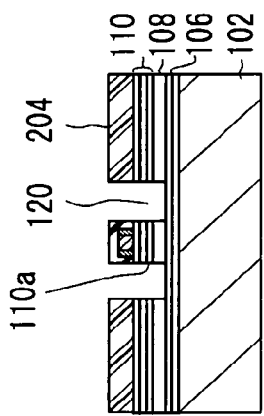
FIG. 10B
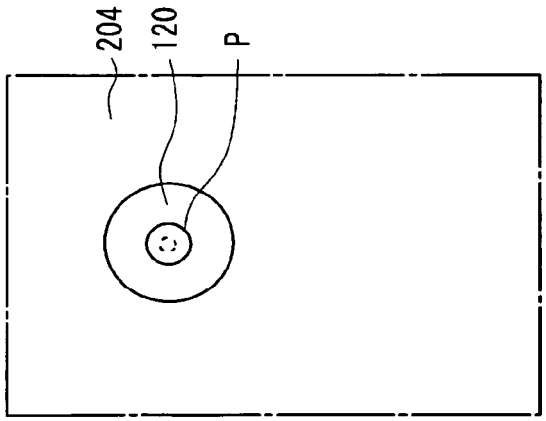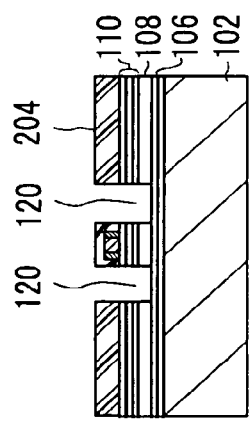
FIG. 10A FIG. 11A
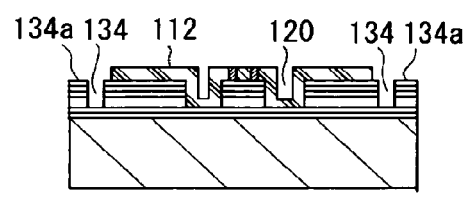
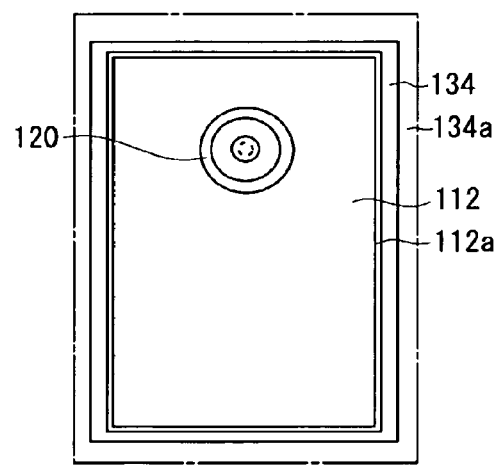
FIG. 11B
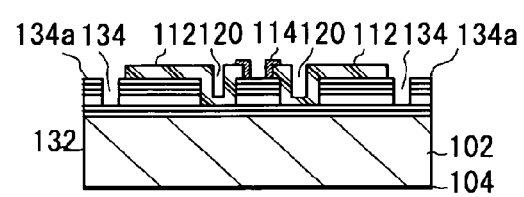
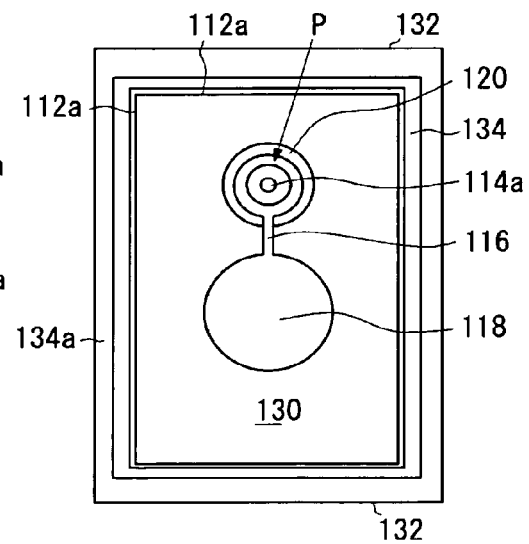

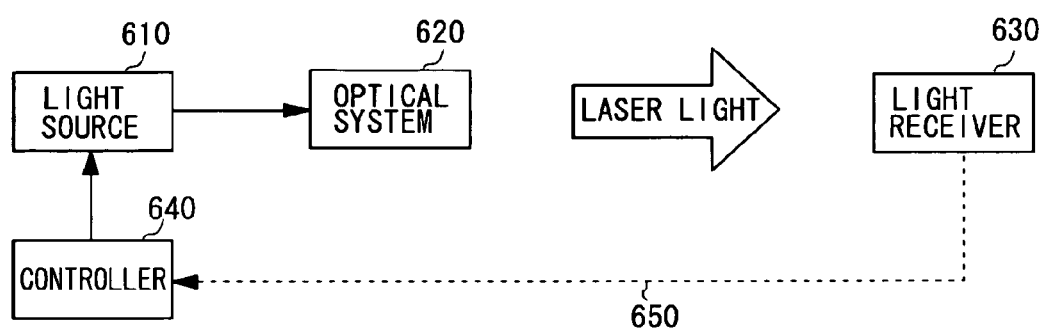
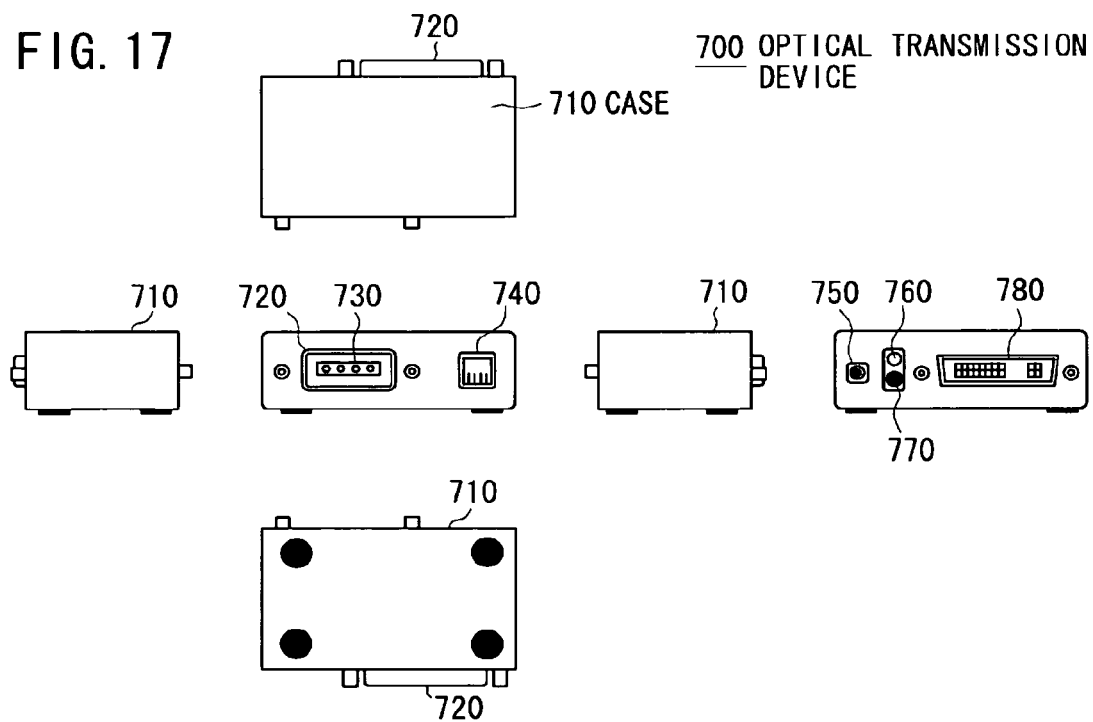

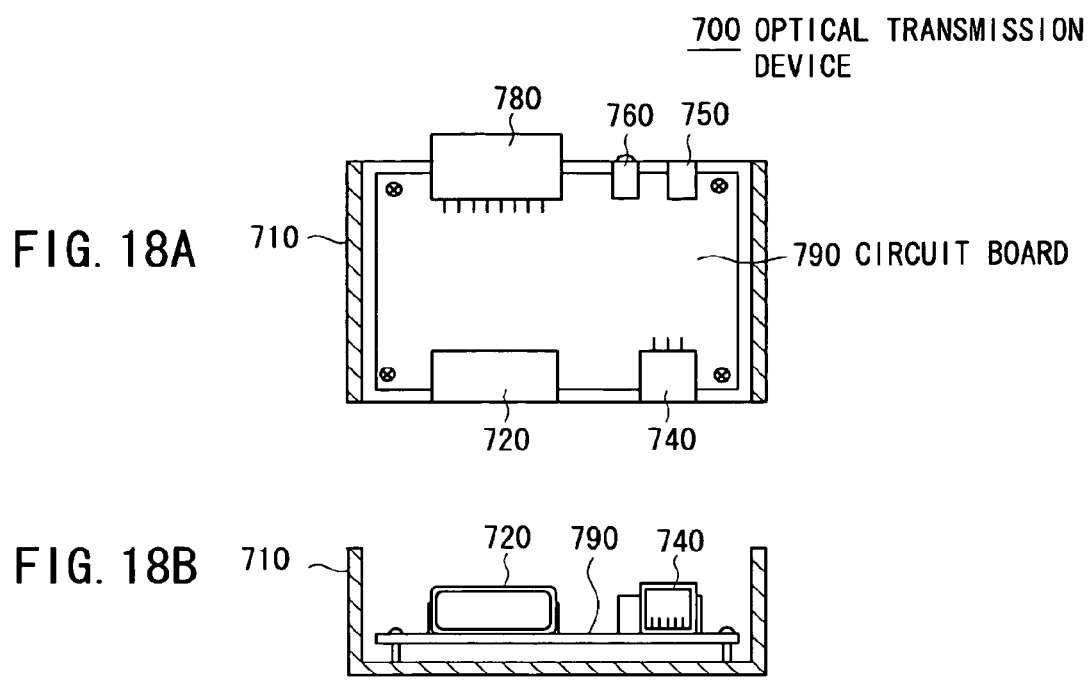
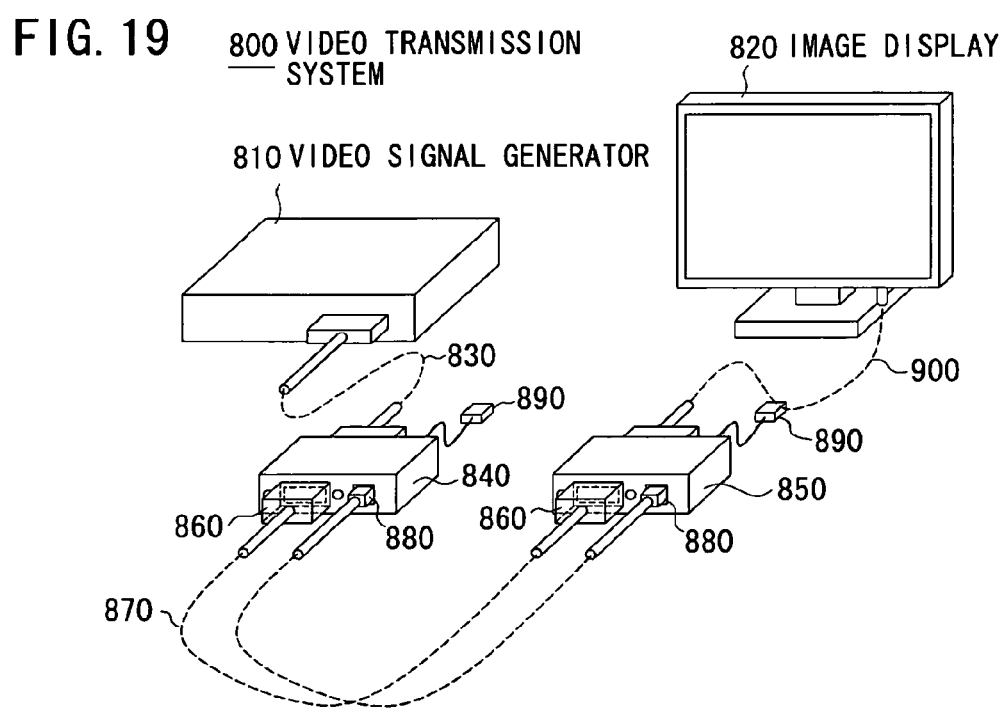

VERTICAL-CAVITY SURFACE-EMITTING LASER (VCSEL) DEVICE AND THE METHOD OF MANUFACTURING THEREOF

CROSS REFERENCE TO RELATED APPLICATION

This application is a division of U.S. application Ser. No. 11/491,705 filed Jul. 24, 2006.

BACKGROUND

1. Technical Field

The present invention relates to a surface-emitting semiconductor device used as a light source of optical data processing or high-speed optical communication, and a method of manufacturing thereof.

2. Related Art

Recently, in technical fields such as optical communication or optical storage, there has been a growing interest in Vertical-Cavity Surface-Emitting Lasers (hereinafter referred to as VCSELs).

VCSELs have excellent characteristics which edge-emitting semiconductor lasers do not have. For example, VCSELs have a lower threshold current and smaller power consumption. With VCSELs, a round light spot can be easily obtained, and evaluation can be performed while they are on a wafer, and light sources can be arranged in two-dimensional arrays. With these characteristics, demands as light sources especially in the communication field have been expected to be arising.

A structure of a VCSEL chip of a related art is shown in FIGS. 21A and 21B. FIG. 21A is a plan view of a VCSEL chip 1, and FIG. 21B is a cross sectional view of FIG. 21A taken along line A-A. The VCSEL chip 1 includes an n-side electrode 3 on the back surface of, for example, a GaAs substrate 2, and on the front surface of the GaAs substrate 2, multiple semiconductor layers of AlGaAs-type are stacked. By etching the stacked semiconductor layers, a cylindrical post 4 is formed on the substrate. After forming the post 4, an interlayer insulating film 5 is patterned to cover the post 4 and exposed AlGaAs layer close to the post. On the interlayer insulating film 5, an electrode pad 6 and an extraction electrode 7 are formed, and the extraction wiring 7 is electrically coupled to a p-side electrode in the post 4.

Due to hygroscopicity of Al in the AlGaAs layer, the interlayer insulating film 5 may be delaminated from the undercoating, and the post 4 may be released from the substrate 2. Especially when the substrate 2 is diced, stress may be created in an interface between the AlGaAs layer and the interlayer insulating film 5 due to, for example, difference in thermal expansion coefficient. From the interface, moisture may enter and thus delamination of the interlayer insulating film 5 may be enhanced. This may damage the electrode pad 6 and the extraction wiring 7 formed on the interlayer insulating film 5, and may cause failures.

FIG. 22 shows an example in which multiple VCSELs are formed on a wafer W. Each VCSEL is cut out from the wafer along dicing lines L into individual chips. As shown in FIG. 23, the chip has chipping in which its cutting plane 20 becomes jagged. When wet high temperature operating life test is conducted for such a VCSEL chip, at a temperature of 85 degrees Celsius and a humidity of 85%, for example, a crazing or crack 22 may grow from the cracked portion of cutting plane 20 toward incide of the chip. Almost the whole area of the wafer including a post 28 is covered with an interlayer insulating film 24, and on the interlayer insulating film 24, an electrode pad 26 is formed. When the crack 22 grows incide, the interlayer insulating film 24 may be delaminated. This may damage the electrode pad 26 and the extraction wiring. Also, unwanted stress may be applied on the post 28, which may cause device failure.

SUMMARY

An aspect of the present invention provides a Vertical-Cavity Surface-Emitting Laser (VCSEL) device including: a substrate; a first semiconductor multi-layer film of a first conductive type formed on the substrate; an active layer; a second semiconductor multi-layer film of a second conductive type; an electrode pad electrically coupled to the second semiconductor multi-layer film; and a post structure formed on the substrate, the post structure comprising a light emitter, the post structure being continuously surrounded by a first groove, and a second groove being continuously formed outside of the first groove with respect to the post structure.

BRIEF DESCRIPTION OF THE DRAWINGS

Embodiments of the present invention will be described in detail based on the following figures, wherein:

FIG. 1A is a cross sectional view taken along line A1-A1, and FIG. 1B is a plan view;

FIG. 2A is a cross sectional view taken along line A2-A2, and FIG. 2B is a plan view;

FIG. 3A is a cross sectional view taken along line A3-A3, and FIG. 3B is a plan view;

FIG. 4A is a cross sectional view taken along line A4-A4, FIG. 4B is a plan view, and FIG. 4C is a cross sectional view taken along line B-B;

FIG. 5A is a cross sectional view taken along line A5-A5, and FIG. 5B is a plan view;

FIGS. 6A and 6B show a VCSEL according to a sixth example of the present invention, FIG. 6A is a cross sectional view taken along line A1-A1, and FIG. 6B is a plan view;

FIGS. 10A to 10C are cross sectional views to illustrate a method for manufacturing a VCSEL according to a first example of the present invention;

FIGS. 11A and 11B are cross sectional views to illustrate a method for manufacturing a VCSEL according to a first example of the present invention;

FIG. 16 is a block diagram showing a configuration of an optical transmission system;

FIG. 17 shows an external view of an optical transmission device;

FIGS. 18A and 18B show an inner configuration of an optical transmission device, FIG. 18A shows an inner configuration with upper portion removed, and FIG. 18B shows an inner configuration with side portion removed;

FIG. 19 shows a video transmission system using the optical transmission device of FIG. 17;

DETAILED DESCRIPTION

Now exemplary embodiments of the present invention will be described referring to the accompanying drawings.

Figure 1A:
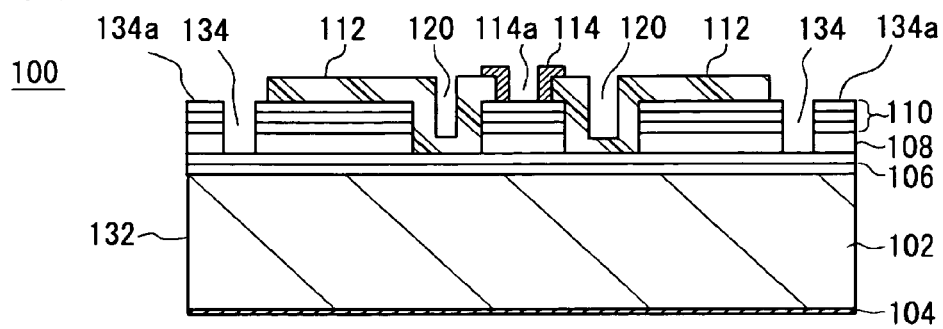
FIGS. 1A and 1B show a VCSEL according to a first example of the present invention.
Figure 1B:
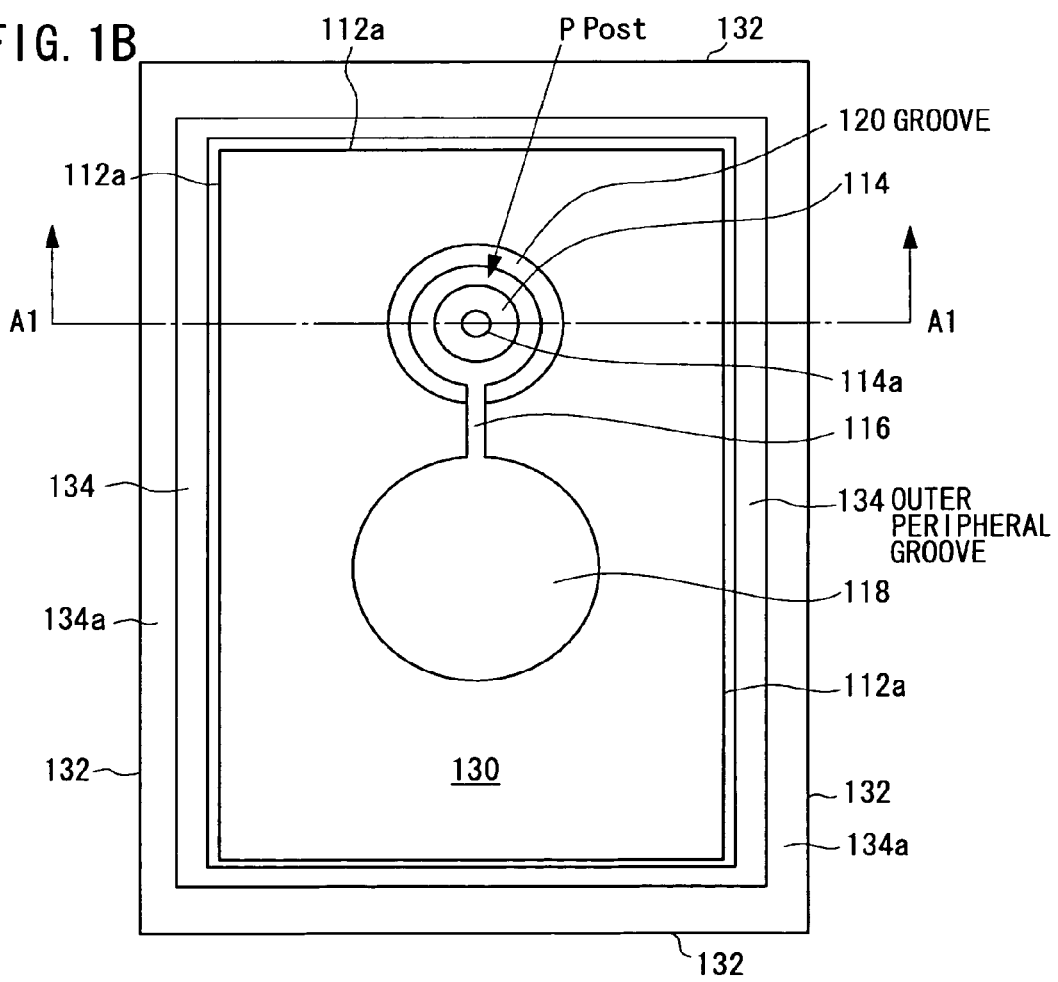

FIGS. 1A and 1B show a structure of a VCSEL device according to a first example of the present invention. FIG. 1A is a cross sectional view of FIG. 1B taken along line A1-A1, and FIG. 1B is a plan view. A VCSEL 100 shown in FIGS. 1A and 1B may be provided by cutting multiple VCSELs formed on a GaAs wafer into chips along dicing lines.

The VCSEL 100 includes an n-type GaAs substrate 102, an n-side electrode 104 formed on the back surface of the substrate 102, a lower semiconductor multi-layer film 106 containing n-type AlGaAs formed on the substrate 102, an active layer 108, an upper semiconductor multi-layer film 110 containing p-type AlGaAs formed on the active layer 108, an interlayer insulating film 112 formed on the upper semiconductor multi-layer film 110, a p-side electrode 114, a wiring electrode 116 coupled to the p-side electrode 114, and an electrode pad 118 coupled to the wiring electrode 116. The lower semiconductor multi-layer film 106 and the upper semiconductor multi-layer film 110 act as a Distributed Bragg Reflector (DBR). The upper semiconductor multi-layer film 110 includes a p-type AlAs layer at the bottommost layer thereof and a p-type GaAs contact layer at the topmost layer thereof. The AlAs layer acts as a current-confined layer containing an oxidized region at the periphery thereof.

The substrate 102 has a rectangular shape, and at an approximate center thereof, a cylindrical post P is formed. The post P acts as a light emitter that emits laser light at a direction substantially perpenticular to the substrate. An annular shape groove 120 is formed to surround the post P. In other words, the groove 120 defines the outline of the post P. The annular shape groove 120 has a depth that reaches part of the lower semiconductor multi-layer film 106, and a width of about 20 micrometers.

At a top portion of the post P, a contact hole is formed in the interlayer insulating film 112. Then, the p-type contact layer being the topmost layer of the upper semiconductor multi-layer film 110 is ohmic-contacted to the p-side electrode 114 through the contact hole. In the center of the p-side electrode 114, a round emitting window 114 to emit laser light is formed. A protecting film may be formed in an emitting window 114a.

A surrounding region or pad-forming region 130 is formed, separated from the post P by the annular shape groove 120. The surrounding region 130 includes the same semiconductor layers as the post P does. On the semiconductor layers of the surrounding region 130, the wiring electrode 116 and the electrode pad 118 are formed through the interlayer insulating film 112. The wiring electrode 116 extends in the groove 120, and is couple to the p-side electrode 114 of the post P.

The first example is characterized in that a rectangular outer peripheral groove 134 is formed at an outer periphery of the surrounding region 130 along a dicing plane 132 of the substrate 102. The outer peripheral groove 134 has a width of about 20 micrometers, for example, at a position about 20 micrometers away from the dicing plane 132. Preferably, the outer peripheral groove 134 is formed simultaneously with the formation of the groove 120, and has the same depth as that of the groove 120, and reaches part of the lower semiconductor multi-layer film 106. Then, the interlayer insulating film 112 covers the entire surrounding region 130 containing the post P, and its edge 112a is terminated before the outer peripheral groove 134.

In the VCSEL of the example, the outer peripheral groove 134 is formed along the dicing plane 132 of the substrate. Thus a crack or crazing due to chipping occurred at the dicing plane 132 grows to an outer peripheral region 134a that is outside of the outer peripheral groove 134, but, the growth is blocked or suppressed by the outer peripheral groove 134. Therefore, in the region inside of the outer peripheral groove 134, it can be effectively suppressed that the interlayer insulating film 112 is delaminated, or that the wiring electrode 116, the electrode pad 118, and the post P are damaged. Thus operating life of the light emitter of the post P can be elongated.

Figure 2A:
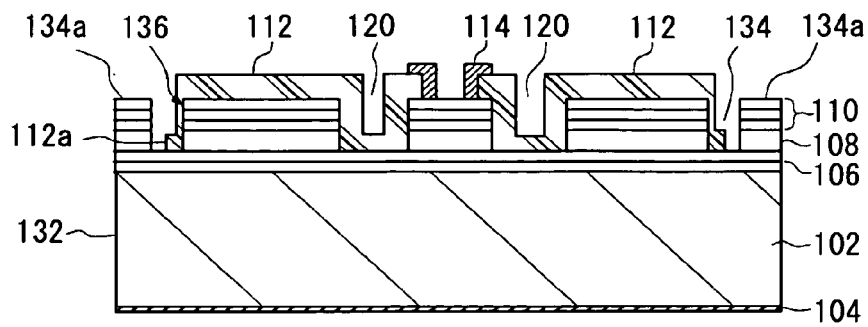
FIGS. 2A and 2B show a VCSEL according to a second example of the present invention.
Figure 2B:
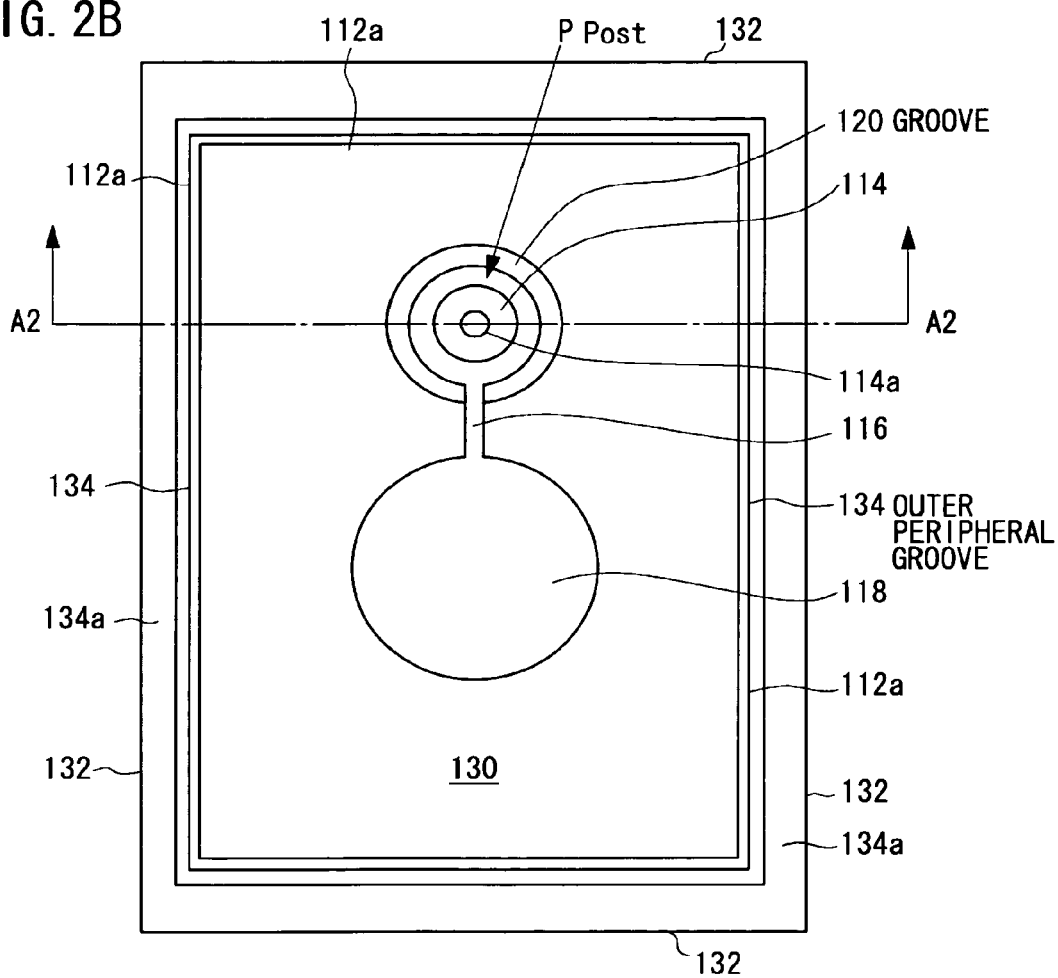

Next, a second example of the present invention is described referring to FIGS. 2A and 2B. The same references have been retained for similar configurations to those of the first example. In a VCSEL of the second example, the edge 112a of the interlayer insulating film 112 is terminated in the outer peripheral groove 134 so that the interlayer insulating film 112 covers part of the outer peripheral groove 134. The lower semiconductor multi-layer film 106 exposed by the outer peripheral groove 134 contains an Al-composition. The Al may react with moisture or the like and may be oxidized, and may cause degradation or erosion of semiconductor layers. In addition, from a sidewall 136 of the semiconductor layers, layers containing an Al-composition are exposed by the groove 134, and thus oxdation may proceed at the sidewall. Therefore, by extending the interlayer insulating film 112 to cover part of the outer peripheral groove 134 so that the layers containing an Al-composition is not exposed, the layers can be protected from erosion or degradation.

Preferably, the interlayer insulating film 112 does not cover the entire bottom portion of the groove 134. This is because, if the interlayer insulating film 112 covers the entire bottom portion, the interlayer insulating film 112 may be easily delaminated due to a crack from the dicing plane 132 and the crack may proceed inside, which will reduce the effect of crack suppression by the groove 134.

Figure 3A:
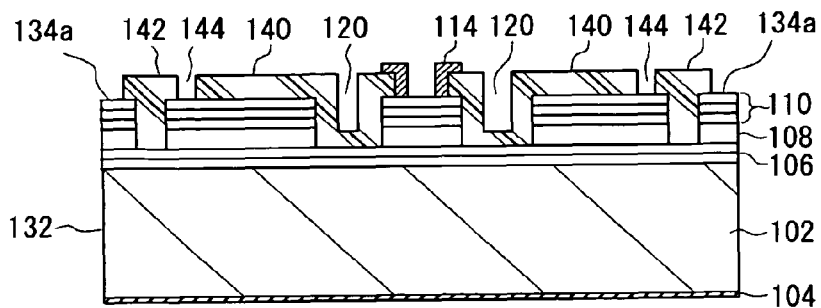
FIGS. 3A and 3B show a VCSEL according to a third example of the present invention.
Figure 3B:
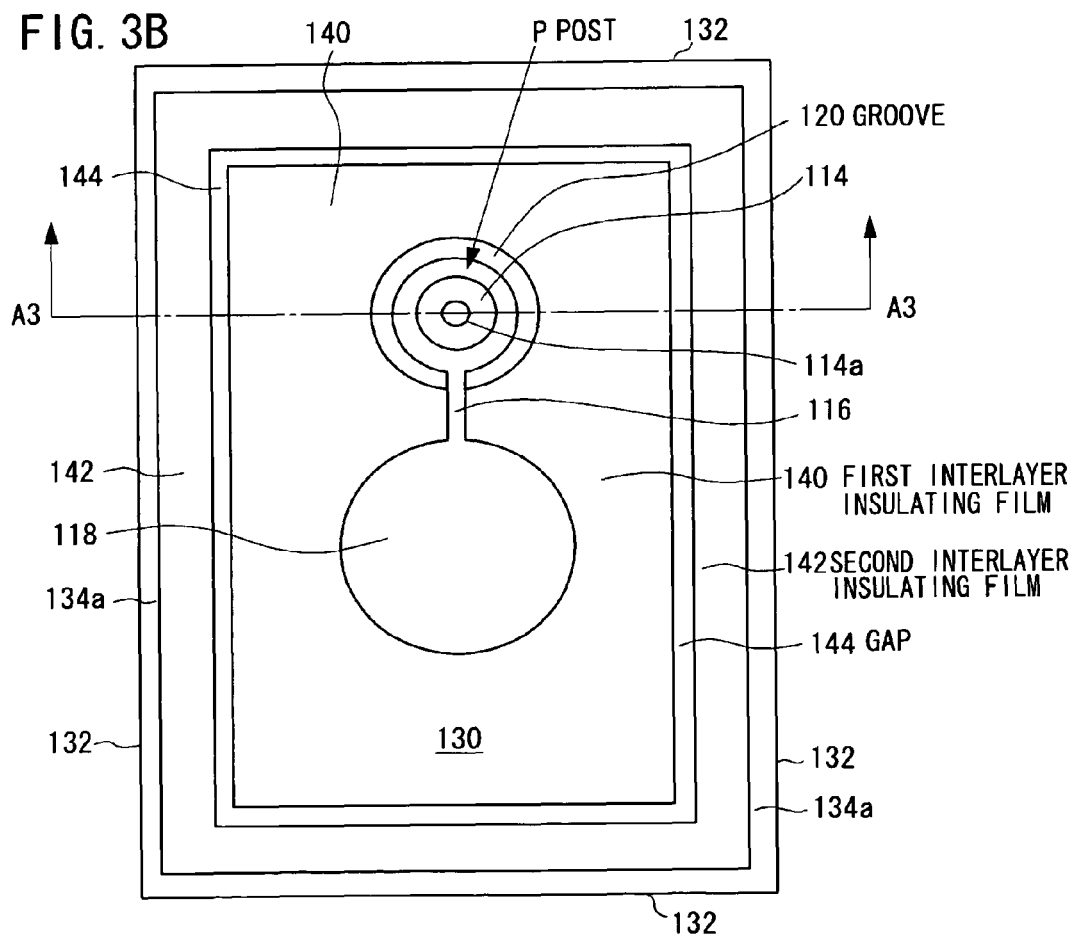

Next, a third example of the present invention is described referring to FIGS. 3A and 3B. In a VCSEL according to the third example, a second interlayer insulating film 142 isolated from a first interlayer insulating film 140 that is terminated inside of the outer peripheral groove 134 is formed to fill the outer peripheral groove 134. The first interlayer insulating film 140 covers the region inside of the outer peripheral groove 134, similarly to the first example. The second interlayer insulating film 142 is isolated from the first interlayer insulating film 140 by a rectangular gap 144.

The semiconductor layers exposed by the outer peripheral groove 134 may be protected from moisture or humidity by the second interlayer insulating film 142. Cracking or crazing caused by chipping of the dicing plane 132 grows in an outer peripheral region 134a outside of the outer peripheral groove 134. Even if the second interlayer insulating film 142 is delaminated, the delamination does not easily propagate into the first interlayer insulating film 140 because the first interlayer insulating film 140 is separated from the second interlayer insulating film 142 by the gap 144. With this configuration, in the region inside of the outer peripheral groove 134, delamination or the like of the first interlayer insulating film 140 can be suppressed effectively.

Figure 4A:
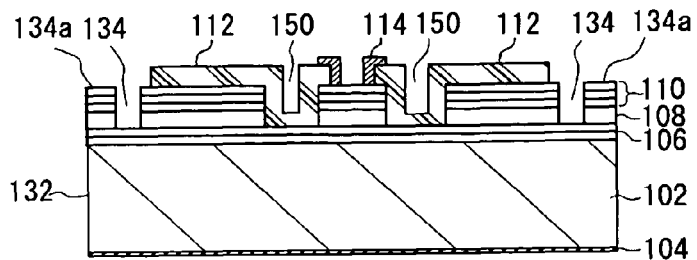
FIGS. 4A to 4C show a VCSEL according to a fourth example of the present invention.
Figure 4B:
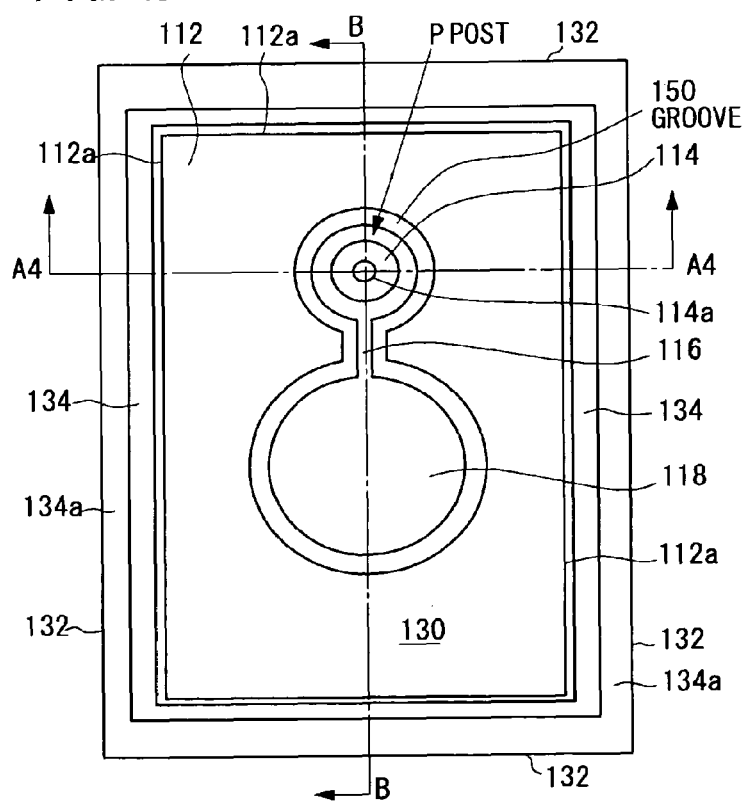
Figure 4C:
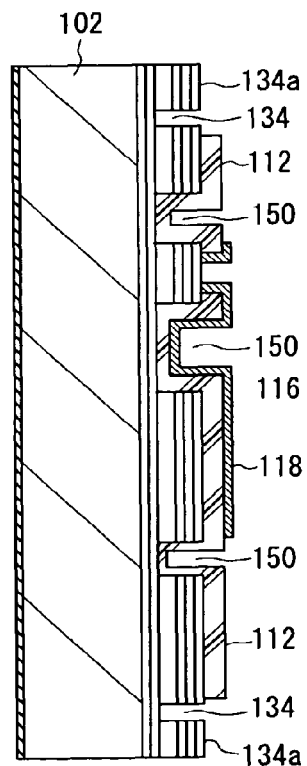

Next, a fourth example of the present invention is described referring to FIGS. 4A to 4C. In a VCSEL according to the fourth example, an inner groove 150 surrounds not only the outline of the post P, but also the outline of the wiring electrode 116 and electrode pad 118. Cracking that grows inward from the dicing plane 132 or the delamination of the interlayer insulating film 112 caused by the crack can be suppressed by the outer peripheral groove 134. By providing the groove 150 along the outline of the wiring electrode 116 and the electrode pad 118, even if the crack grows over the outer peripheral groove 134, the growth can be further suppressed by the inner groove 150. This enables to delay the time the light emitter of the post P results in failure.

Figure 5A:
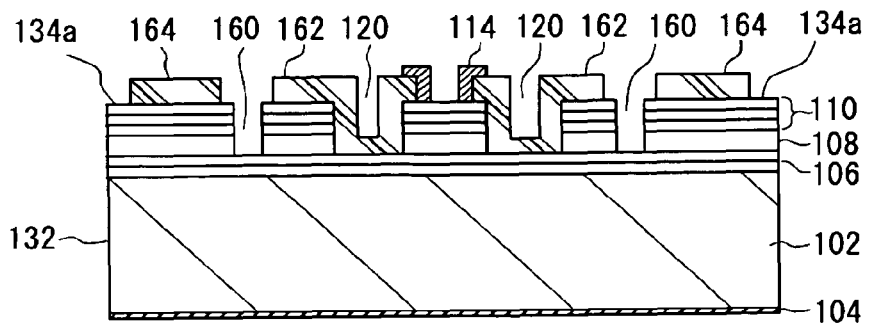
FIGS. 5A and 5B show a VCSEL according to a fifth example of the present invention.
Figure 5B:
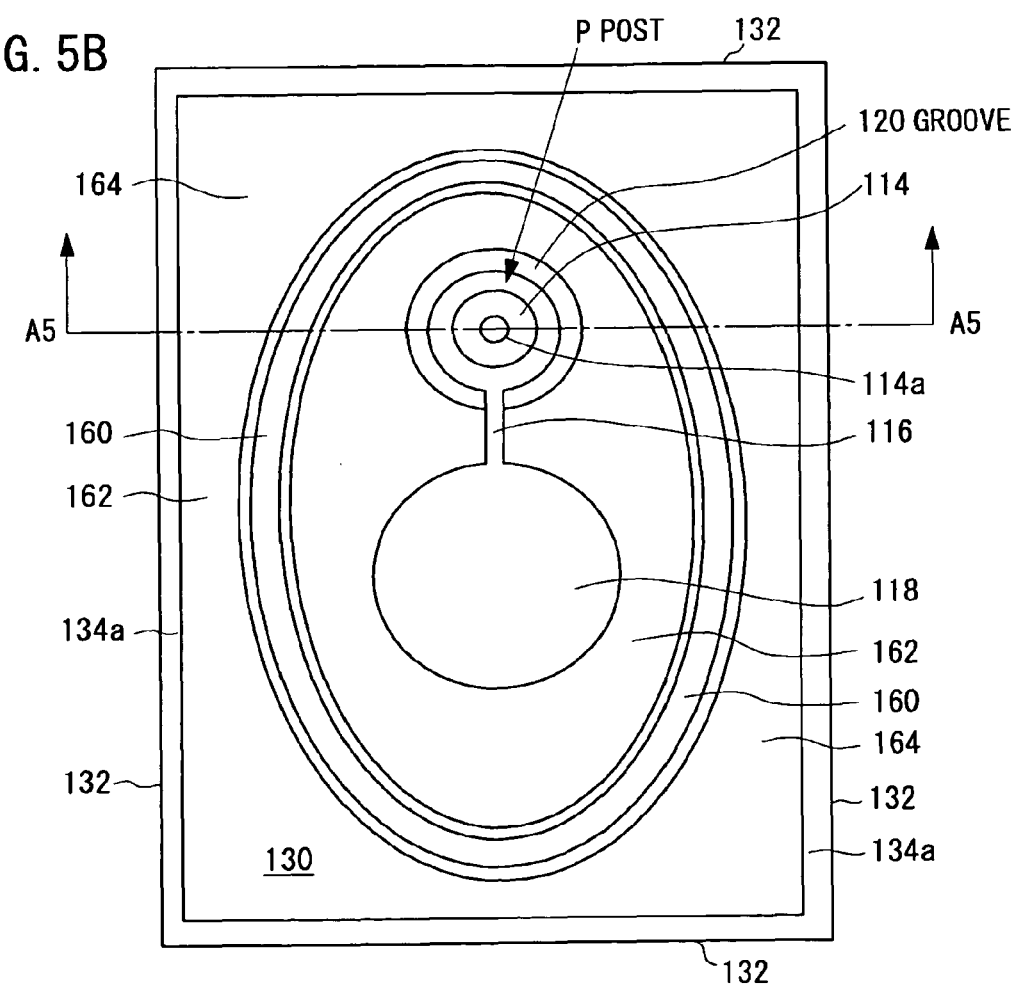

Then, a fifth example of the present invention is described referring to FIGS. 5A and 5B. In a VCSEL according to the fifth example, the shape of an outer peripheral groove 160 is oval. Inner side of the outer peripheral groove 160 is covered by a first interlayer insulating film 162. A second interlayer insulating film 164 isolated from the first interlayer insulating film on the outer peripheral groove 160 covers a surrounding region 130. Because of the curvature of the outer peripheral groove 160, it does not have directivity in a direction to alleviate cracks compared to a linear groove, cracking that grows from the dicing plane 132 can be effectively suppressed. Alternatively, the outer peripheral groove 160 may be other shapes than oval, such as a circular. In addition, it may be a groove in which corners of the rectangular groove of the first example are rounded off in arc shapes.

Next, a sixth example of the present invention is described referring to FIGS. 6A and 6B. In a VCSEL according to the sixth example, an outer peripheral groove 170 has a depth deeper than that of the inner groove 120 that surrounds the post P, and reaches to the surface of the substrate 102. By providing the outer peripheral groove 170 that reaches the surface, exposure of the lower semiconductor multi-layer film with Al-content may be reduced, and thus degradation or erosion of the lower semiconductor layers can be suppressed.

Figure 7:
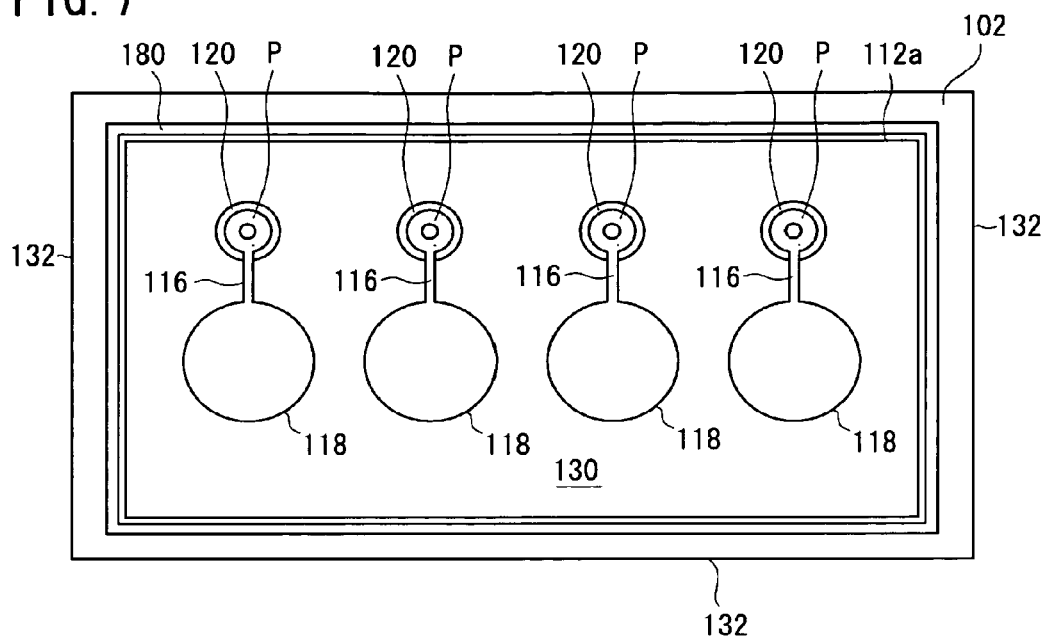
FIG. 7 is a plan view of a VCSEL according to a seventh example of the present invention.

Then, a seventh example of the present invention is described referring to FIG. 7. VCSELs according to the seventh example are 1×4 multi-spot type of arrays. As shown in FIG. 7, four posts P are arranged linearly on the substrate 102, and each of the posts is surrounded by a groove 120. In the surrounding region 130 outside of the grooves 120, wiring electrodes 116 each coupled to a p-side electrode of each of the posts P and electrode pads 118 are formed. An outer peripheral groove 180 is formed to surround these four posts P, wiring electrodes 116, and electrode pads 118. Preferably, the outer peripheral groove 180 may be formed along the dicing plane 132 of the rectangular substrate. The number of the posts formed on the arrays is not necessarily four, and they may be arrays in which posts are arranged two-dimensionally. In the above example, one outer peripheral groove 180 surrounds four posts P, i.e., four grooves 120. However alternatively, multiple (for example, two) outer peripheral grooves 180 may be formed, and each of the outer peripheral grooves 180 may surround two grooves 120.

Figure 8:
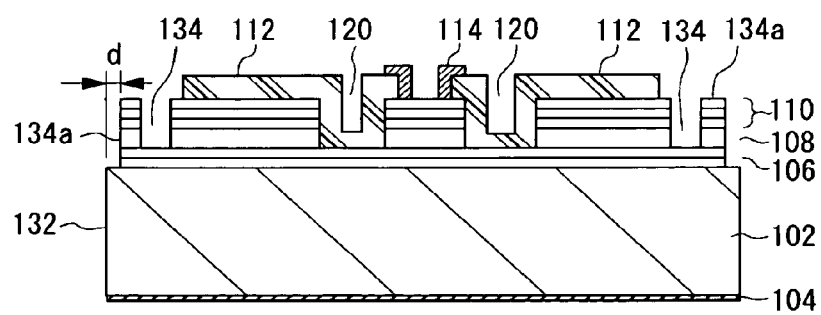
FIG. 8 is a cross sectional view of a VCSEL according to an eighth example of the present invention.

Next, an eighth example of the present invention is described referring to FIG. 8. In a VCSEL according to the eighth example, the sidewall of the outer peripheral region 134a outside of the outer peripheral groove 134 is offset inward by a distance d from the dicing plane 132 of the substrate. For example, on a wafer, a groove having a predetermined width may be previously formed along the dicing line until it reaches the substrate 102. Then, by using a dicer having a narrower width than the groove, the substrate 102 may be cut along the groove to obtain the offset amount d.

With the eighth example, an advantage can be obtained that cracking due to chipping does not easily propagate in the outer peripheral region 134a because the sidewall of the outer peripheral region 134a is offset inward.

Now, a method for manufacturing a VCSEL according to a first example is described referring to FIGS. 9A to 11H. In each of these figures, one VCSEL prior to the dicing of the substrate is shown.

Figure 9C:
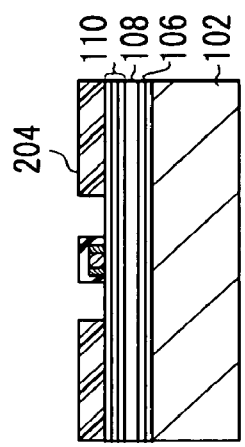
FIGS. 9A to 9C are cross sectional views to illustrate a method for manufacturing a VCSEL according to a first example of the present invention.
Figure 9B:
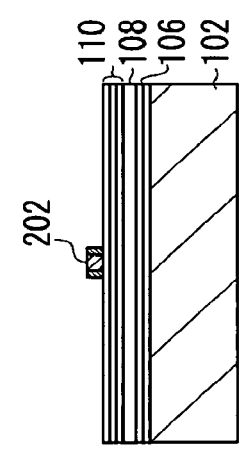
Figure 9A:
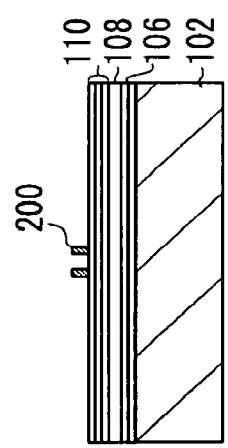

As shown in FIG. 9A, on the surface of an n-type GaAs substrate 102 (100), a lower semiconductor multi-layer film 106 made of multi-layer stacks of n-type $Al_{0.8}Ga_{0.2}As$ layer and n-type $Al_{0.1}Ga_{0.9}As$ layer; an active region 108 made of a stack of a spacer layer of undoped $Al_{0.4}Ga_{0.6}As$ layer, a barrier layer of undoped $Al_{0.2}Ga_{0.8}As$ layer, and a quantum well layer of undoped GaAs layer; and an upper semiconductor multi-layer film 110 made of a p-type AlAs layer 110a, multi-layer stacks of p-type $Al_{0.8}Ga_{0.2}As$ layer and p-type $Al_{0.1}Ga_{0.9}As$ layer, and a contact layer 110b made of a p-type GaAs layer are sequentially stacked by Metal Organic Chemical Vapor Deposition (MOCVD). On the surface of the upper semiconductor multi-layer film 110, a patterned resist layer is formed. Then Au and Ti are stacked, and an annular shape of a contact electrode 200 is formed in a lift-off process.

The lower semiconductor multi-layer film 106 is made of multi-layer stacks of n-type $Al_{0.8}Ga_{0.2}As$ layer and n-type $Al_{0.1}Ga_{0.9}As$ layer, each of which has a thickness of λ/4 nr (wherein λ is lasing wavelength, nr is optical refractive index in the medium). The multi-layer is formed by alternately stacking, for example, 36.5 periods of layers, each having a different mixed crystal ratio. Carrier concentration after silicon is doped as an n-type impurity is, for example, $3\times10^{18}$ $cm^{-3}$. In the active region 108, stacks in which a quantum well active layer having a thickness of 8 nm made of undoped GaAs layer and a barrier layer having a thickness of 5 nm made of undoped $Al_{0.2}Ga_{0.8}As$ layer are alternately stacked (wherein outer layer is a barrier layer) is placed in the center portion of the spacer layer made of undoped $Al_{0.4}Ga_{0.6}As$ layer. The film thickness of the spacer layer containing the quantum well active layer and the barrier layer is designed to be an integral multiple of λ/4 nr. From the active region 108 having such a configuration, radiation light having a wavelength of 850 nm can be obtained.

The upper semiconductor multi-layer film 110 is a stack of multiple semiconductor layers made of p-type $Al_{0.8}Ga_{0.2}As$ layer and p-type $Al_{0.1}Ga_{0.9}As$ layer. The thickness of each layer is λ/4 nr. The multi-layer is formed by stacking, for example, 22 periods of layers, each having a different mixed crystal ratio. The number of the periods equals to the sum of the number of the AlAs layers 110a provided in the lower layer and the contact layers 110b provided in the upper layer. The carrier concentration after carbon is doped as a p-type impurity is, for example, $3\times10^{18}$ $cm^{-3}$.

Then, SiON is formed over the entire substrate. By using a known photolithography process, an opening of a contact electrode 200, i.e., an emission protecting film 202 for protecting the emitting outlet, is pattern-formed, as shown in FIG. 9B.

Next, SiN is formed over the entire substrate. As shown in FIG. 9C, by using a known photolithography process, a mask pattern 204 for forming a post is formed.

Then, as shown in FIG. 10A, by using the mask pattern 204 as a mask, anistropic etching of the stacked semiconductor layers is performed to form a cylindrical post P on the substrate. By this etching, a groove 120 that surrounds the post P is formed. The depth of the groove 120 or the etching is a length to reach part of the lower semiconductor multi-layer film 106.

Next, as shown in FIG. 10B, for example, the substrate is exposed to a vapor atmosphere at 340 degrees Celsius for a predetermined period for oxdation. The AlAs layer 110a that forms part of the upper multi-layer reflective film 110 has far faster oxidation speed than $Al_{0.8}Ga_{0.2}As$ layer or $Al_{0.1}Ga_{0.9}As$ layer does, both of which also form part of the upper multi-layer reflective film 110. Thus an oxidized region that corresponds to the shape of the post is formed from side surface of the post P. Remaining non-oxidized region becomes a current-applying region or conductive region.

Then, as shown in FIG. 10C, after the mask pattern 202 is removed, SiN is formed over the entire substrate. The SiN is patterned by a photolithography process to form an interlayer insulating film 112. In the interlayer insulating film 112, a contact hole is formed to expose the contact electrode 200 at a top portion of the post.

Next, as shown in FIG. 11A, by using a photolithography process, an outer peripheral groove 134 is formed. The outer peripheral groove 134 is formed outside of an edge 112a of the interlayer insulating film 112 and inside of the surface to be diced.

Then, as shown in FIG. 11B, a resist pattern is formed by using a photolithography process. Then Au/Ti is formed, and a p-side electrode 114, a wiring electrode 116, and an electrode pad 118 are formed by lift-off. On the back surface of the substrate, an n-side electrode 104 made of Au or Ge is formed. Then, the substrate is diced into VCSEL chips to obtain VCSELs 100 of the first example.

It should be understood that the manufacturing steps shown above are exemplary only, and it is possible to manufacture VCSELs by using other steps. The groove 120 and the outer peripheral groove 134 may be formed simultaneously, or the groove 134 may be formed when the post P is formed. For example, with the mask pattern 204 shown in FIG. 10B, the groove 120 and the groove 134 may be formed simultaneously. In addition, materials or the like of the insulating film or electrode may be other materials, and the shape of the post, electrode pad, or groove may be modified as appropriate. Furthermore, while the outer peripheral groove 134 in the above example is shown as a continuous groove, it may be modified into divided multiple grooves. For example, four linear outer peripheral grooves may be formed along each side surface of the dicing plane of the substrate.

Figure 12:
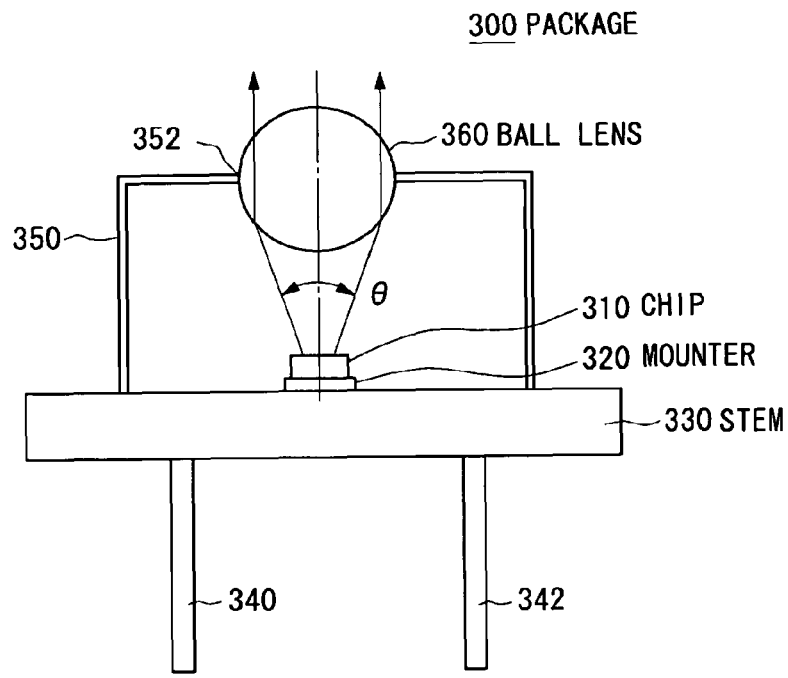
FIG. 12 is a schematic cross sectional view showing a structure of a package in which a semiconductor chip on which VCSEL is formed is mounted.

FIG. 12 shows a schematic cross sectional view of an example of a package (module) of a semiconductor laser device in which a VCSEL array chip is mounted. As shown in FIG. 12, in a package 300, a chip 310 on which VCSEL array is formed is fixed on a disc-shaped metal stem 330, interposing a die-attach on a mounter 320. Conductive leads 340 and 342 are inserted into through holes (not shown) in the stem 330. One lead 340 is electrically coupled to a lower electrode formed on the back surface of the chip 310, and the other lead 342 is electrically coupled to an upper electrode formed on the upper surface of the chip 310, for example, via a bonding wire.

In an emitting window 352 of a cap 350, a ball lens 360 is fixed. The optical axis of the ball lens 360 is positioned to match an approximate center of the chip 310. The distance between the chip 310 and the ball lens 360 may be adjusted so that the ball lens 360 is contained within the radiation angle θ of the laser light from the chip 310. When a forward voltage is applied between the leads 340 and 342, laser light is emitted from the chip 310. In the cap, a light sensing element may be contained to monitor the emitting status of the VCSEL.

Figure 13:
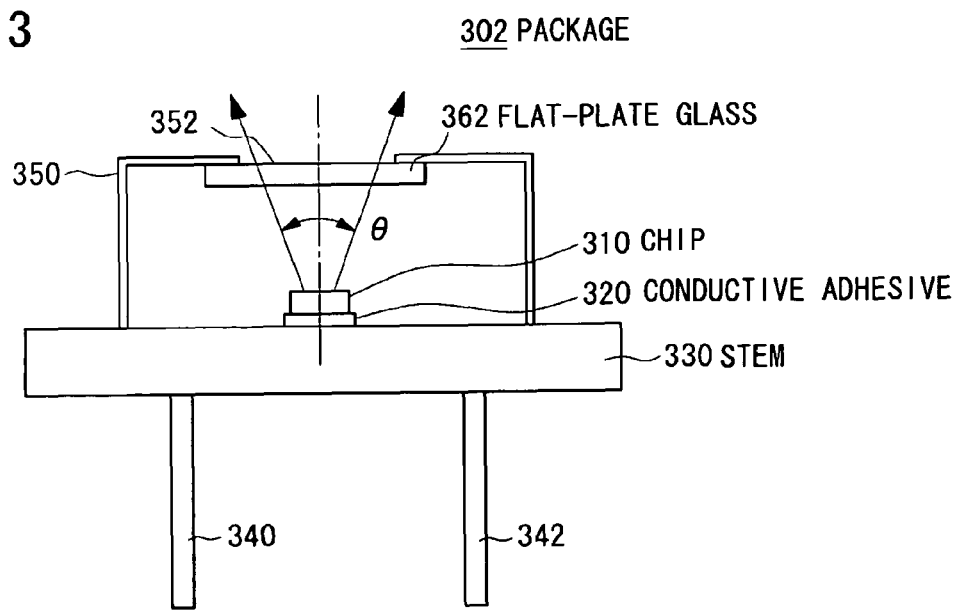
FIG. 13 is a schematic cross sectional view to show a structure of other package.

FIG. 13 shows a structure of another package, and preferably, used in a spatial transmission system mentioned later. In a package 302 shown in FIG. 13, instead of using the ball lens 360, a flat-plate glass 362 is fixed in the emitting window 352 in the center of the cap 350. The center of the flat-plate glass 362 is positioned to match an approximate center of the chip 310. The distance between the chip 310 and the flat-plate glass 362 may be adjusted so that opening diameter of the flat-plate glass 362 is equal to or greater than the radiation angle θ of the laser light from the chip 310.

Figure 14:
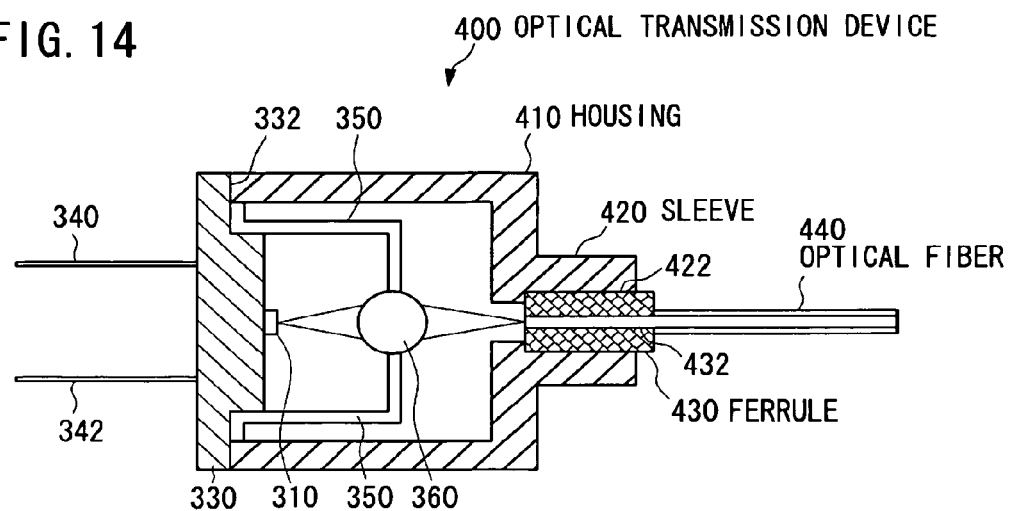
FIG. 14 is a cross sectional view showing a structure of an optical transmission device using a package shown in FIG. 12.

FIG. 14 is a cross sectional view showing a configuration in which a package or module shown in FIG. 12 is applied to an optical transmission device. An optical transmission device 400 includes a cylindrical housing 410 fixed to a stem 330, a sleeve 420 formed integral with the housing 410 on the edge surface thereof, a ferrule 430 held in an opening 422 of the sleeve 420, and an optical fiber 440 held by the ferrule 430.

In a flange 332 formed in a direction of the circumference of the stem 330, an edge of the housing 410 is fixed. The ferrule 430 is positioned exactly in the opening 422 of the sleeve 420, and the optical axis of the optical fiber 440 is aligned with the optical axis of the ball lens 360. In a through hole 432 of the ferrule 430, the core of the optical fiber 440 is held.

Laser light emitted from the surface of the chip 310 is concentrated by the ball lens 360. The concentrated light is injected into the core of the optical fiber 440, and transmitted. While the ball lens 360 is used in the above example, other lenses such as a biconvex lens or a plano-convex lens may be used. In addition, the optical transmission device 400 may include a driving circuit for applying an electrical signal to the leads 340, 342. Furthermore, the optical transmission device 400 may have receiving function to receive an optical signal via the optical fiber 440.

Figure 15:
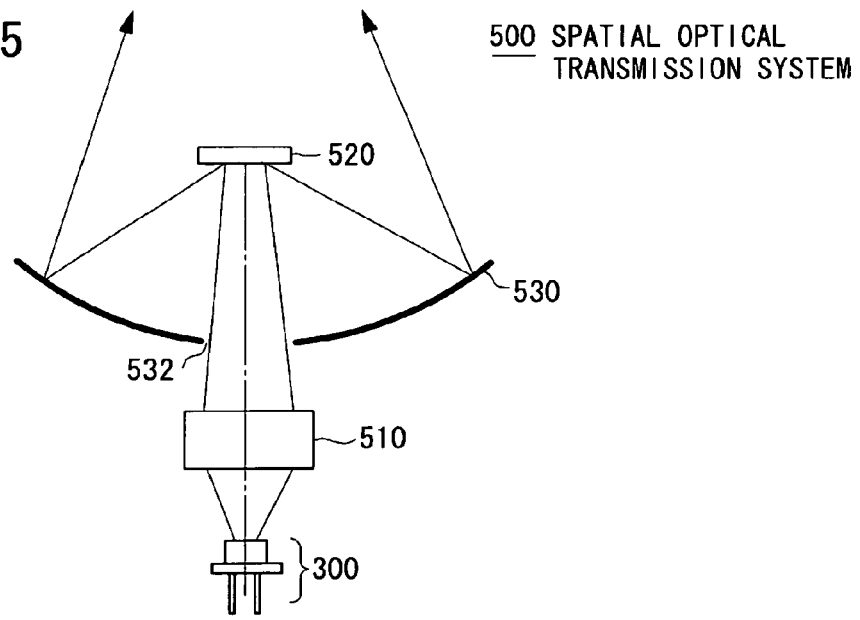
FIG. 15 shows a structure in which a package shown in FIG. 13 is used for an optical transmission system.

FIG. 15 shows a configuration in which the package shown in FIG. 13 is used in a spatial transmission system. A spatial transmission system 500 includes a package 300, a condensing lens 510, a diffusing plate 520, and a reflective mirror 530. In the spatial transmission system 500, instead of using the ball lens 360 that was used for the package 300, the condensing lens 510 is used. The light concentrated by the condensing lens 510 is reflected by the diffusing plate 520 through an opening 532 of the reflective mirror 530. The reflected light is reflected toward the reflective mirror 530. The reflective mirror 530 reflects the reflected light toward a predetermined direction to perform optical transmission. For the light source of spatial transmission, multi-spot type VCSELs may be used to obtain a higher output.

FIG. 16 shows an example of a configuration of an optical transmission system in which a VCSEL is used as a light source. An optical transmission system 600 includes a light source 610 that contains a chip 310 on which a VCSEL is formed, an optical system 620, for example, for concentrating laser light emitted from the light source 610, a light receiver 630 for receiving laser light outputted from the optical system 620, and a controller 640 for controlling the driving of the light source 610. The controller 640 provides a driving pulse signal for driving the VCSEL to the light source 610. The light emitted from the light source 610 is transmitted through the optical system 620 to the light receiver 630 by an optical fiber or a reflective mirror for spatial transmission. The light receiver 630 detects the received light by a photo-detector, for example. The light receiver 630 is capable of controlling operations (for example, the start timing of optical transmission) of the controller 640, by a control signal 650.

Next, configuration of optical transmission device used for an optical transmission system is described. FIG. 17 is an external view of an optical transmission device, and FIGS. 18A and 18B are schematic views to show an inner configuration of an optical transmission device. An optical transmission device 700 includes a case 710, an optical signal transmitting/receiving connector 720, a light emitting/light receiving element 730, an electrical signal cable connector 740, a power input 750, an LED 760 for indicating normal operation, an LED 770 for indicating an abnormality, a DVI connector 780, a transmitting circuit board/receiving circuit board 790.

Figure 20:
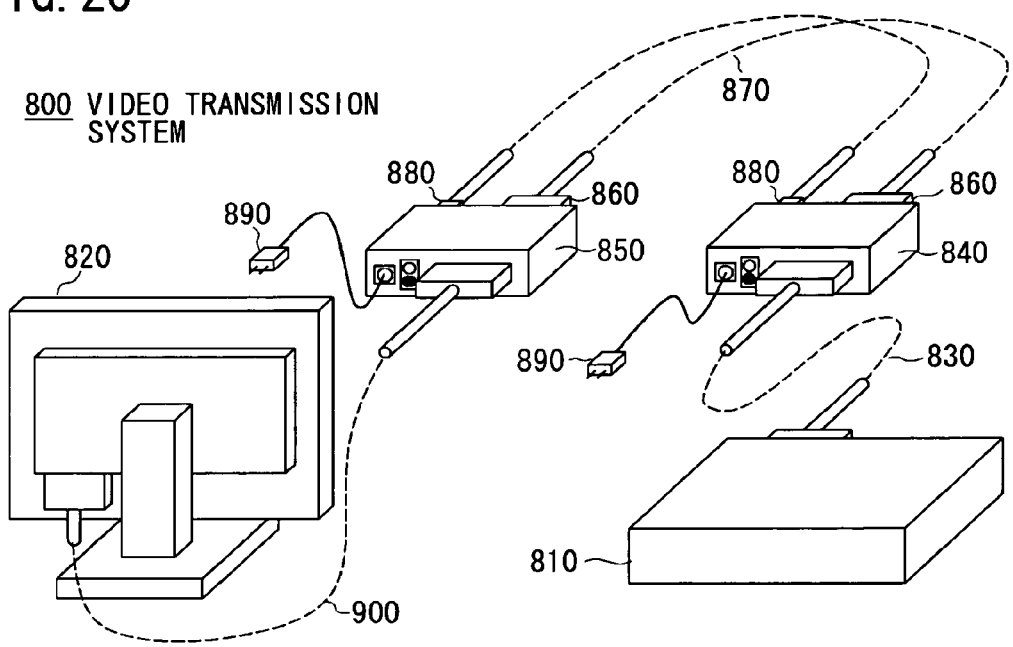
FIG. 20 shows a rear view of the video transmission system of FIG. 19.
Figure 21A:
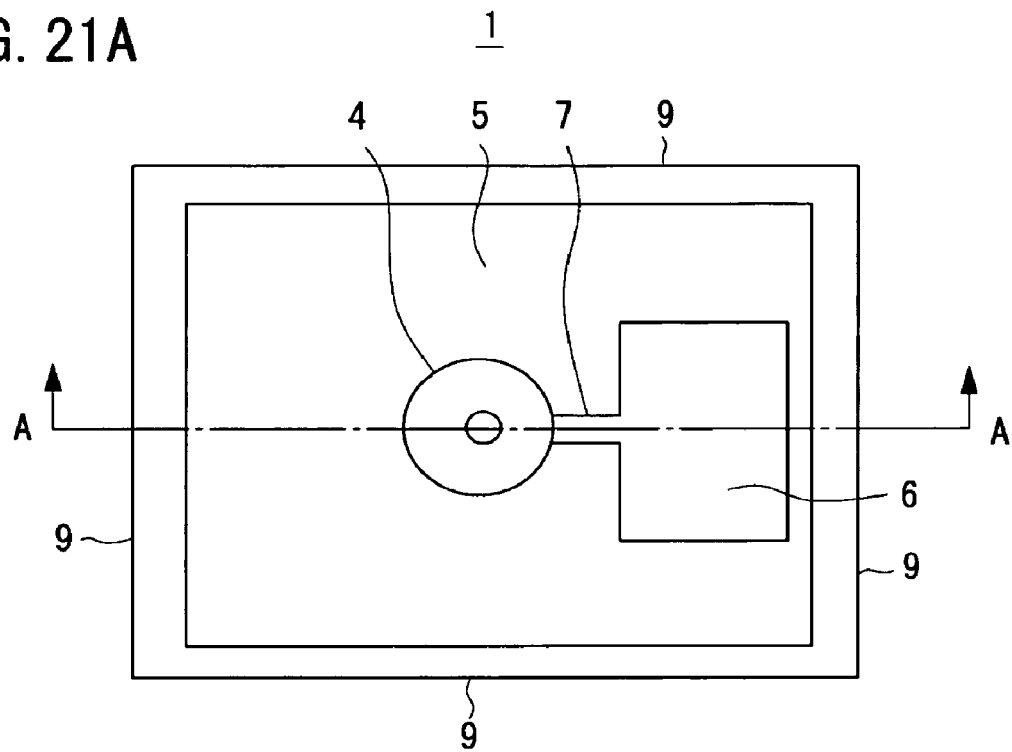
FIGS. 21A and 21B are a plan view and a cross sectional view of a VCSEL of a related art.
Figure 21B:
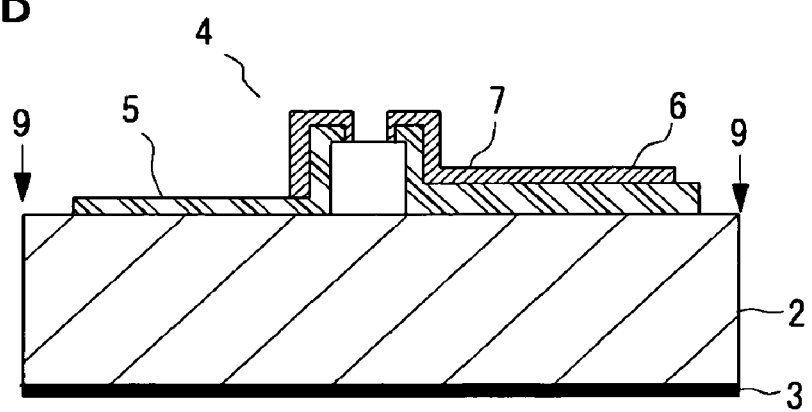
Figure 22:
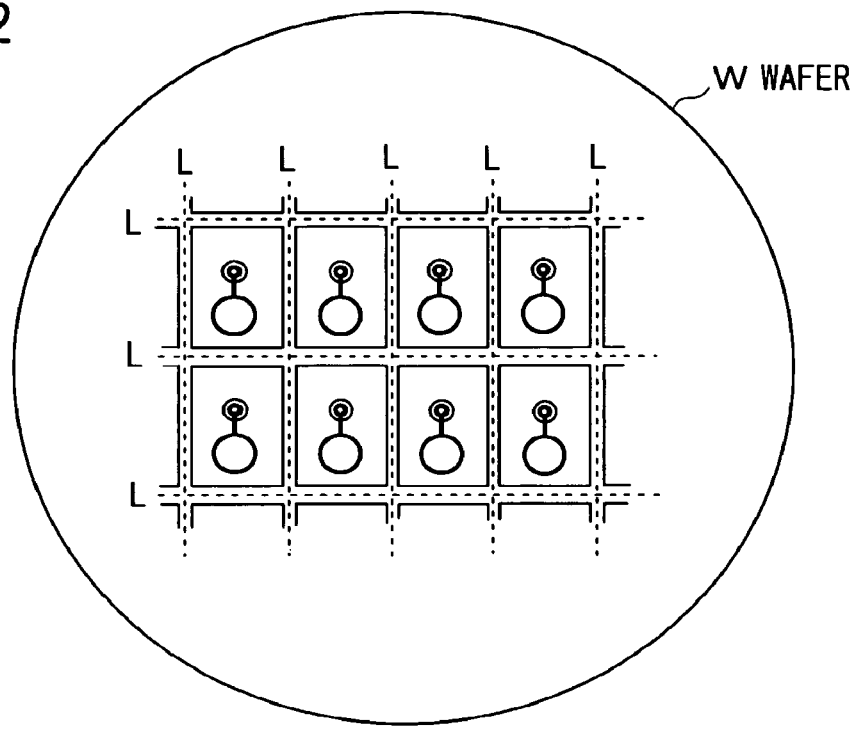
FIG. 22 is a plan view showing multiple VCSELs formed on a wafer.
Figure 23:
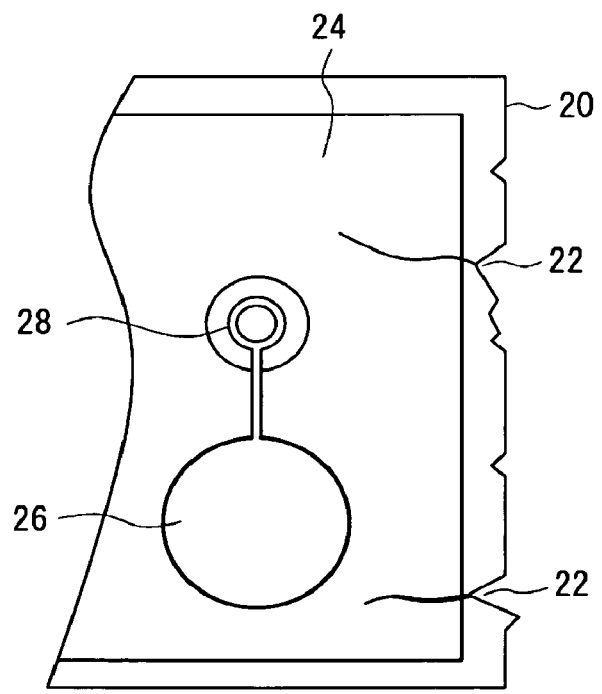
FIG. 23 shows chipping of a VCSEL.

A video transmission system in which an optical transmission device 700 is used is shown in FIG. 19 and FIG. 20. In these figures, an optical video transmission system 800 uses the optical transmission system shown in FIG. 17 to transmit a video signal generated at a video signal generator 810 to an image display 820 such as a liquid crystal display. More specifically, the video transmission system 800 includes a video signal generator 810, an image display 820, an electrical cable 830 for DVI, a transmitting module 840, a receiving module 850, a connector 860 for video signal transmission optical signal, an optical fiber 870, an electrical cable connector 880 for video signal transmission, a power adapter 890, and an electrical cable 900 for DVI.

In the above video transmission system, the transmissions between the video signal generator 810 and the transmitting module 840, and between the receiving module 850 and the image display 820 are performed by an electrical signal through the electrical cables 830 and 900, respectively. However, these transmissions may be performed by an optical signal. For example, instead of using electrical cables 830 and 900, a signal transmission cable in which an electrical/optical converter circuit and an optical/electrical converter circuit are contained in a connector may be used.

A surface-emitting semiconductor device according to an aspect of the invention can be used in various fields such as optical data processing or optical high-speed data communication.

What is claimed is:

1. A Vertical-Cavity Surface-Emitting Laser (VCSEL) device comprising:
   a substrate;
   a first semiconductor multi-layer film of a first conductive type formed on the substrate;
   an active layer;
   a second semiconductor multi-layer film of a second conductive type;
   an electrode pad electrically coupled to the second semiconductor multi-layer film;
   a post structure formed on the substrate, the post structure comprising a light emitter, and
   a wiring electrode extracted from the post structure, the electrode pad being coupled to the wiring electrode,
   the post structure being continuously surrounded by a first groove, and a second groove being continuously formed outside of the first groove with respect to the post structure and along with a dicing surface of the substrate,
   the first groove being formed along an outer periphery of the post structure, the wiring electrode, and the electrode pad,
   the first and second grooves being formed simultaneously to have the same depth respectively,
   a part of the post structure and the first groove being covered with a first insulating protection film, and
   the second groove being covered with a second insulating protection film separated from the first insulating protection film by a gap between the first groove and second groove.

2. The VCSEL device according to claim 1, wherein the second groove surrounds the post structure and the electrode pad in a shape including a curve.

3. The VCSEL device according to claim 1, wherein the second groove has a depth that reaches at least from the second semiconductor multi-layer film to the substrate.

4. The VCSEL device according to claim 1, wherein:
   the post structure and a pad-forming region isolated from the post structure by the first groove comprise the same semiconductor layers;
   an upper electrode in which an emitting window is formed is formed on the semiconductor layers of the post structure;
   an electrode pad is formed on the semiconductor layers of the pad-forming region;
   the upper electrode and the electrode pad being coupled to a wiring electrode through the first groove;
   a third groove is formed outside of the second groove;
   the third groove comprises a sidewall that defines an outer periphery of the pad-forming region; and
   the sidewall being offset inward from a dicing plane of the substrate.

5. The VCSEL device according to claim 1, wherein:
   a plurality of post structures are formed on the substrate;
   each of the post structures being surrounded by each of corresponding plurality of first grooves; and
   the second groove is formed in a periphery outward from the plurality of first grooves.

6. A module having a VCSEL comprising:
   a substrate;
   a first semiconductor multi-layer film of a first conductive type formed on the substrate;
   an active layer;
   a second semiconductor multi-layer film of a second conductive type;
   an electrode pad electrically coupled to the second semiconductor multi-layer film;
   a post structure formed on the substrate, the post structure comprising a light emitter; and
   a wiring electrode extracted from the post structure, the electrode pad being coupled to the wiring electrode,
   the post structure being continuously surrounded by a first groove, and a second groove being continuously formed outside of the first groove with respect to the post structure and along with a dicing surface of the substrate,
   the first groove being formed along an outer periphery of the post structure, the wiring electrode, and the electrode pad,
   the first and second grooves being formed simultaneously to have the same depth respectively,
   a part of the post structure and the first groove being covered with a first insulating protection film, and
   the second groove being covered with a second insulating protection film separated from the first insulating protection film by a gap between the first groove and second groove.

7. An optical transmission device having a VCSEL comprising:
   a substrate;
   a first semiconductor multi-layer film of a first conductive type formed on the substrate;
   an active layer;

a second semiconductor multi-layer film of a second conductive type;
an electrode pad electrically coupled to the second semiconductor multi-layer film;
a post structure formed on the substrate, the post structure comprising a light emitter;
a wiring electrode extracted from the post structure, the electrode pad being coupled to the wiring electrode; and
a transmitting unit that transmits laser light emitted from the module through an optical medium,
the post structure being continuously surrounded by a first groove, and a second groove being continuously formed outside of the first groove with respect to the post structure and along with a dicing surface of the substrate,
the first groove being formed along an outer periphery of the post structure, the wiring electrode, and the electrode pad,
the first and second grooves being formed simultaneously to have the same depth respectively,
a part of the post structure and the first groove being covered with a first insulating protection film, and
the second groove being covered with a second insulating protection film separated from the first insulating protection film by a gap between the first groove and second groove.

8. An optical spatial transmission device having a VCSEL comprising:
a substrate;
a first semiconductor multi-layer film of a first conductive type formed on the substrate;
an active layer;
a second semiconductor multi-layer film of a second conductive type;
an electrode pad electrically coupled to the second semiconductor multi-layer film;
a post structure formed on the substrate, the post structure comprising a light emitter;
a wiring electrode extracted from the post structure, the electrode pad being coupled to the wiring electrode; and
a transmitting unit that spatially transmits light emitted from the module,
the post structure being continuously surrounded by a first groove, and a second groove being continuously formed outside of the first groove with respect to the post structure and along with a dicing surface of the substrate,
the first groove being formed along an outer periphery of the post structure, the wiring electrode, and the electrode pad,
the first and second grooves being formed simultaneously to have the same depth respectively,
a part of the post structure and the first groove being covered with a first insulating protection film, and
the second groove being covered with a second insulating protection film separated from the first insulating protection film by a gap between the first groove and second groove.

9. An optical transmission system having a VCSEL comprising:
a substrate;
a first semiconductor multi-layer film of a first conductive type formed on the substrate;
an active layer;
a second semiconductor multi-layer film of a second conductive type;
an electrode pad electrically coupled to the second semiconductor multi-layer film;
a post structure formed on the substrate, the post structure comprising a light emitter;
a wiring electrode extracted from the post structure, the electrode pad being coupled to the wiring electrode; and
a transmitting unit that transmits laser light emitted from the module,
the post structure being continuously surrounded by a first groove, and a second groove being continuously formed outside of the first groove with respect to the post structure and along with a dicing surface of the substrate,
the first groove being formed along an outer periphery of the post structure, the wiring electrode, and the electrode pad,
the first and second grooves being formed simultaneously to have the same depth respectively,
a part of the post structure and the first groove being covered with a first insulating protection film, and
the second groove being covered with a second insulating protection film separated from the first insulating protection film by a gap between the first groove and second groove.

10. An optical spatial transmission system having a VCSEL comprising:
a substrate;
a first semiconductor multi-layer film of a first conductive type formed on the substrate;
an active layer;
a second semiconductor multi-layer film of a second conductive type;
an electrode pad electrically coupled to the second semiconductor multi-layer film;
a post structure formed on the substrate, the post structure comprising a light emitter;
a wiring electrode extracted from the post structure, the electrode pad being coupled to the wiring electrode; and
a transmitter that spatially transmits light emitted from the module,
the post structure being continuously surrounded by a first groove, and a second groove being continuously formed outside of the first groove with respect to the post structure and along with a dicing surface of the substrate,
the first groove being formed along an outer periphery of the post structure, the wiring electrode, and the electrode pad,
the first and second grooves being formed simultaneously to have the same depth respectively,
a part of the post structure and the first groove being covered with a first insulating protection film, and
the second groove being covered with a second insulating protection film separated from the first insulating protection film by a gap between the first groove and second groove.

11. A method for manufacturing a VCSEL device in which a light emitter of a post structure is formed on a substrate, a wiring electrode is extracted from the post structure, and an electrode pad is coupled to the wiring electrode, the method comprising:
stacking semiconductor layers on the substrate, the semiconductor layers including at least a first semiconductor multi-layer film of a first conductive type, an active layer, and a second semiconductor multi-layer film of a second conductive type;
forming a first groove in the semiconductor layers so that the first groove surrounds at least the post structure;
forming a second groove in the semiconductor layers simultaneously with the first groove so that the second groove surrounds the first groove and the first and second grooves have the same depth respectively;

forming a first insulating protection film that covers a part of the post structure and the first groove;

forming a second insulating protection film that covers the second groove and is separated from the first insulating protection film by a gap between the first groove and second groove; and dicing the substrate so that the second groove is remained, wherein the first groove is formed along an outer periphery of the post structure, the wiring electrode, and the electrode pad.

12. The manufacturing method according to claim 11 further comprising forming a third groove in the semiconductor layers, the third groove corresponding to a dicing region, wherein the substrate is diced along the third groove.

13. A method for manufacturing a VCSEL device in which a light emitter of a post structure is formed on a substrate, a wiring electrode is extracted from the post structure, and an electrode pad is coupled to the wiring electrode, comprising:

stacking semiconductor layers on the substrate, the semiconductor layers including at least a first semiconductor multi-layer film of a first conductive type, an active layer, and a second semiconductor multi-layer film of a second conductive type;

simultaneously forming a first groove and a second groove in the semiconductor layers to have the same depth respectively, the first groove surrounding at least the post structure, and the second groove surrounding the first groove;

forming a first insulating protection film that covers a part of the post structure and the first groove;

forming a second insulating protection film that covers the second groove and is separated from the first insulating protection film by a gap between the first groove and second groove; and dicing the substrate so that the second groove is remained, wherein the first groove is formed along an outer periphery of the post structure, the wiring electrode, and the electrode pad.

14. The manufacturing method according to claim 13 further comprising forming a third groove in the semiconductor layers simultaneously with the formation of the first and the second grooves, wherein the third groove corresponds to a dicing region, and the substrate being diced along the third groove.

15. The VCSEL device according to claim 1, wherein the second groove is not completely covered with the second insulating protection film.

* * * * *